United States Patent
Schumann et al.

(10) Patent No.: US 9,183,725 B2
(45) Date of Patent: Nov. 10, 2015

(54) METHOD AND DEVICE FOR MONITORING AT LEAST ONE PARAMETER OF A BATTERY

(71) Applicants: Bernd Schumann, Rutesheim (DE); Niluefer Baba, Stuttgart (DE); Matthias Gernsbeck, Karlsruhe-Gruenwettersbach (DE)

(72) Inventors: Bernd Schumann, Rutesheim (DE); Niluefer Baba, Stuttgart (DE); Matthias Gernsbeck, Karlsruhe-Gruenwettersbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 82 days.

(21) Appl. No.: 14/032,943

(22) Filed: Sep. 20, 2013

(65) Prior Publication Data

US 2014/0085094 A1    Mar. 27, 2014

(30) Foreign Application Priority Data

Sep. 21, 2012   (DE) .......................... 10 2012 217 037

(51) Int. Cl.

| G08B 21/00 | (2006.01) |
| G08B 21/18 | (2006.01) |
| G01R 31/36 | (2006.01) |
| H01M 6/50 | (2006.01) |
| H01M 10/48 | (2006.01) |

(52) U.S. Cl.
CPC .......... *G08B 21/182* (2013.01); *G01R 31/3682* (2013.01); *G01R 31/3686* (2013.01); *H01M 6/505* (2013.01); *H01M 10/48* (2013.01); *H01M 10/486* (2013.01); *H01M 10/488* (2013.01)

(58) Field of Classification Search
CPC ............... Y02E 60/12; G01R 31/3682; G01R 31/3686; H01M 6/505; H01M 10/488
USPC ............... 340/636.1; 324/435; 429/90, 91, 92
See application file for complete search history.

(56) References Cited

U.S. PATENT DOCUMENTS

| 5,250,905 | A | * | 10/1993 | Kuo et al. ..................... 324/435 |
| 5,339,024 | A | * | 8/1994 | Kuo et al. ..................... 324/435 |
| 5,355,089 | A | * | 10/1994 | Treger .......................... 324/435 |
| 5,399,445 | A | * | 3/1995 | Tinker .............................. 429/90 |
| 5,557,208 | A | * | 9/1996 | Parker ........................... 324/435 |
| 6,977,123 | B1 | * | 12/2005 | Burroughs et al. .............. 429/92 |
| 7,828,859 | B2 | * | 11/2010 | Chung et al. .................. 429/176 |
| 8,415,044 | B2 | * | 4/2013 | Chung et al. .................... 429/90 |
| 2007/0054178 | A1 | * | 3/2007 | Moon et al. ..................... 429/90 |
| 2012/0133521 | A1 | * | 5/2012 | Rothkopf et al. .......... 340/636.1 |

FOREIGN PATENT DOCUMENTS

| DE | 38 18 694 | 12/1988 |
| WO | 10 2009 035479 | 2/2011 |

* cited by examiner

*Primary Examiner* — John A Tweel, Jr.
(74) *Attorney, Agent, or Firm* — Kenyon & Kenyon LLP

(57) ABSTRACT

A method for monitoring at least one parameter of a battery. The method has a step of providing, in which a visual damage signal is provided on an outer surface of the battery when the at least one parameter of the battery is outside a tolerance range.

10 Claims, 2 Drawing Sheets

METHOD AND DEVICE FOR MONITORING AT LEAST ONE PARAMETER OF A BATTERY

RELATED APPLICATION INFORMATION

The present application claims priority to and the benefit of German patent application no. 10 2012 217 037.5, which was filed in Germany on Sep. 21, 2012, the disclosure of which is incorporated herein by reference.

FIELD OF THE INVENTION

The present invention relates to a method for monitoring at least one parameter of a battery, a device which uses this method, a battery having the device, and a corresponding computer program product.

BACKGROUND INFORMATION

German patent document DE 10 2009 035 479 A1 discusses a device for storing electrical energy.

SUMMARY OF THE INVENTION

Against this background, the present invention presents a method for monitoring at least one parameter of a battery, a device for monitoring at least one parameter of a battery, a battery having the device, and lastly, a corresponding computer program product, according to the main claims. Advantageous embodiments result from the respective subclaims and the following description.

A battery may be damaged during operation, in storage, during transport, and/or even during manufacture. To allow the damaged battery to be recognized directly, and, according to one specific embodiment, by an observer without auxiliary aids, the battery may be visually marked. The marking may be permanent. Based on the visual marking, a good/bad decision may thus be easily made without complex analytical methods. When there is sufficient illumination, visual recognition may take place without assistance from special tools or reading devices. Relevant damage to a battery may be characterized in that a critical parameter of the battery exceeds an upper limiting value or falls below a lower limiting value. A method for monitoring at least one parameter of a battery is presented, the method having the following step:

providing a visual damage signal on an outer surface of the battery when the at least one parameter of the battery is outside a tolerance range.

A battery may be understood to mean an accumulator. The battery may be an energy store which is configured to store electrical energy as chemical energy in a first process direction when the battery is supplied with electrical energy. In a second process direction opposite the first process direction, the battery may provide stored chemical energy as electrical energy when electrical energy is drawn from the battery. An electrochemical process of conversion between the electrical energy and the chemical energy may optimally take place within certain parameters. If one of the parameters leaves its tolerance range, the electrochemical process may be disturbed or prevented, or proper functioning may no longer be ensured. If the parameter has left the tolerance range, it may be necessary to replace the battery. For example, the electrochemical process may have a temperature tolerance range, a current tolerance range, and/or a voltage tolerance range. A visual damage signal may be a visually recognizable marking and/or identification. The damage signal may be provided by a device for monitoring which is mounted on the battery. The damage signal may also be provided directly on a casing of the battery.

The damage signal may also be provided when the at least one parameter is once again within the tolerance range. The damage signal may be irreversibly provided. A temporary departure from the tolerance range may thus also be signaled, even if at the instantaneous point in time the parameter is once again within the tolerance range.

The at least one parameter may represent a temperature, an acceleration acting on the battery, for example due to an impact, a mechanical deformation, for example due to bending, an electrical voltage, for example for detecting an overvoltage, an electrical current, for example for detecting an overcurrent, or moisture. For example, by monitoring the parameter it may be registered whether the temperature was or is too high or too low for the battery. It may be determined whether the battery has been exposed to an excessively strong impact. For example, it may be determined whether the battery has experienced excessive acceleration. It may likewise be determined whether the battery has experienced excessive deformation. It may be indicated whether an excessively high current and/or an excessively high voltage has/have flowed through the battery. It may be indicated whether the battery has come into contact with one or multiple in particular harmful substances. In particular, it may be indicated whether the battery has become wet.

The damage signal may be generated in the form of a color marking on the outer surface of the battery. A color marking may be applied, for example, when the parameter leaves the tolerance range. Likewise, the color marking may be generated by a change in color of at least one area of the battery. The color marking may also be situated on a signal element which becomes visible when the parameter leaves the tolerance range.

The method may have a step of reading out the damage signal, in which the damage signal is read out in response to a readout signal. For example, a check may be made at predefined intervals as to whether or not the parameter has left the tolerance range in the meantime. For example, an electronic signal may then be generated.

The parameter may be detected in response to a start signal. The parameter may thus be detected at certain time periods. For example, the parameter may be detected only when the battery is in operation. Likewise, the parameter may be detected only during storage of the battery.

The method may include a step of checking whether the at least one parameter is outside the tolerance range, and a step of generating a control signal when the at least one parameter is outside the tolerance range. The damage signal may be provided in response to the electrical control signal. The step of checking may be carried out using a suitable test circuit, for example a comparator. The control signal may be an electrical signal that is transmitted via an electrical line, or a signal transmitted by suitable mechanics, for example a force or a motion. The control signal may also be generated in the form of an output of a chemical substance. The damage signal may be provided when the control signal indicates that the at least one parameter is outside the tolerance range. In this way, for example, the signal of a sensor for detecting the parameter may be evaluated in order to provide the damage signal. A suitable device, for example a piezoelectric device, may be used for providing the damage signal.

The damage signal may be provided on the outside of the battery, using a color change of particles which are sensitive to the parameter. Likewise, the damage signal may be provided by a filter becoming permeable to a predefined wavelength spectrum, for example to make pigments visible which are concealed by the filter. A separate detection device for detecting the parameter is therefore not necessary. The damage signal may thus be provided very quickly and reliably, for example also regardless of the presence of a power supply.

A device for monitoring at least one parameter of a battery is also presented, the device being configured to carry out or implement the step of the method according to the present invention in an appropriate unit. The object of the present invention may also be achieved quickly and efficiently by this embodiment variant of the present invention in the form of a device.

In the present context, a device may be understood to mean an electrical device which processes sensor signals, and as a function thereof outputs control signals and/or data signals. The device may have an interface which may be configured as hardware and/or software. For a hardware design, the interfaces may be part of a so-called system ASIC, for example, which contains various functions of the device. However, it is also possible for the interfaces to be dedicated, integrated circuits, or to be at least partially composed of discrete components. For a software design, the interfaces may be software modules which are present on a microcontroller, for example, in addition to other software modules. Alternatively, the device may be implemented, for example, by sensitive particles which may be situated on the outside of the battery. In addition, the device may be implemented in the form of a container having a suitable material for providing the damage signal, the container being configured to release the material when the parameter leaves the tolerance range.

Moreover, a battery having a device according to the approach described here is presented.

The device may be implemented by particles which are sensitive to the parameter and situated on the outside of the battery, the particles being configured to irreversibly change in color or transparency as the visual damage signal when the parameter is outside the tolerance range.

The present invention is explained in greater detail below as an example, with reference to the appended drawings.

DETAILED DESCRIPTION

Figure 1:
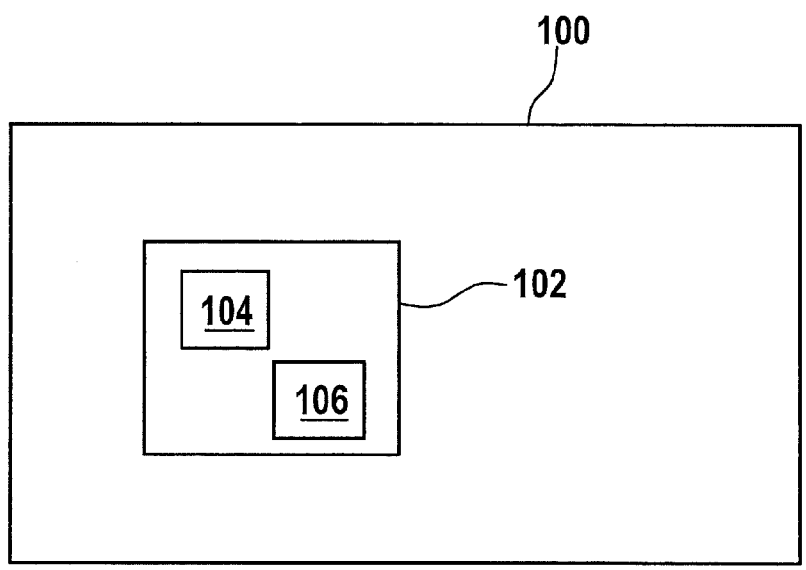
FIG. 1 shows a block diagram of a battery having a device for monitoring at least one parameter of the battery according to one exemplary embodiment of the present invention.

In the following description of exemplary embodiments of the present invention, identical or similar reference numerals are used for the elements having a similar action which are illustrated in the various figures, and a repeated description of these elements is dispensed with.

FIG. 1 shows a block diagram of a battery 100 having a device 102 for monitoring at least one parameter of battery 100 according to one exemplary embodiment of the present invention. Depending on the exemplary embodiment, device 102 has a unit 104 for providing a visual damage signal, or is formed by unit 104. Unit 104 is configured to provide the visual damage signal on an outer surface of battery 100 when the at least one parameter of battery 100 is outside a tolerance range, i.e., for example when a value of the parameter is above or below a threshold value predefined for this parameter.

According to one exemplary embodiment, FIG. 1 shows a battery 100 in the form of an accumulator having a device 102 in the form of a collision and damage detection system for batteries 100. Batteries 100 such as accumulators or lithium-ion batteries are used as energy stores in a variety of products. Thus, they may be configured, for example, as energy stores for current from solar cells or wind power plants, vehicles, and electronic devices.

FIG. 1 shows one advantageous design of a battery 100, or alternatively, of an individual cell, a module, a pack, or a system of multiple cells in a network. As a result of the approach presented here, the installation, maintenance, removal, and repair of battery 100 are safer during use when external effects have improperly acted on battery 100, a cell of battery 100, or the system of cells.

The external effects may be caused, for example, by a collision of a vehicle or a transport accident during delivery, or an action taken during installation or removal, such as dropping the battery.

According to one exemplary embodiment, unit 104 is implemented by an arrangement which may record the effects and generate signals. The arrangement may in particular be read out visually or electrically, or in the visual case, may be read out or also directly observed.

The arrangement may have, for example, a lacquer layer or protective layer which is changeable due to temperature or a mechanical impact or damage, or a layer having incorporated bodies or substances. The layer may, for example, change its color or some other physical or chemical property due to mechanical, electrical, or thermal effects.

Device 102 may also include at least one, sensor 106 which may record and evaluate physical, electrical, or chemical effects.

The damage may occur, for example, due to a mechanical effect, a strong acceleration, a temperature, an electrical effect, and/or a chemical effect. In the event of damage, battery 100 may no longer meet its specifications or its specified state within an allowable operating period. The damage may concern the operating reliability, the corrosion state, and the mode of operation of battery 100, and may have impaired these, for example.

The mechanical effect may be, for example, a dent or an impact on the base or an edge. The temperature may result from a fire or extended exposure to solar radiation. An electrical effect may result, for example, from a short circuit or contact with defective charging devices or contact with lines improperly carrying current. A chemical effect may result, for example, from water, rain, snow, sea water, acid, fire extinguishing agents, or fumes.

The mechanical effect and/or the damage may result, for example, from a collision of a vehicle or a transport accident during delivery, an improperly sealed container on a ship, or poor storage at excessively high temperatures, for example in an action taken in a shop bay during installation or removal.

The properties thus recorded may be relayed to an apparatus, in particular for further processing and for reporting to a central system. This apparatus may be connected to device 102 via communication devices such as mobile telephone networks or Internet networks.

For example, for detecting mechanical or other damage, device 102 may be configured in such a way that a control unit carries out the recording of the damage.

According to one exemplary embodiment, one or multiple acceleration sensors 106, which emit analog or digital signals, in a multiaxial configuration may be mounted on a frame of battery 100, for example in the middle of the system, which are connected to a small computer or an arithmetic unit and a memory device. Acceleration sensors 106 may also be integrated directly into the battery management system.

Additional parameters besides the parameters already recorded in the battery management system or control unit (for example, current, voltage, temperature, etc.) may be generated and electronically or nonelectronically evaluated.

The computer may continuously or intermittently record and evaluate the data of acceleration sensors 106, in particular, always for a brief time period from the past. In addition, the computer may be activated via an electrical signal from the collision/airbag sensors of the automobile in order to record and evaluate the signals of acceleration sensors 106 on module 100, for example just before one of the airbags of the vehicle is deployed. Alternatively, the computer may be started via a trigger signal of a threshold value switch which always starts the computer beginning at a certain acceleration in order to record data from the same sensors.

The memory device may also be provided, for example, with a permanent memory characteristic so that no operating voltage is necessary for reading out the memory device. The readout may be carried out electrically or optoelectronically, or by removing the memory device or by magnetic readout.

In particular, the signal curve, i.e., the signal recording of acceleration sensors 106 initiated by the threshold switch or the collision sensors, may also be compared in the computer to the signals generated after the triggering event, after a certain pause. This pause may, for example, be a certain time period after the accident or the improper handling, and may be associated, for example, with the state of rest after the accident. When this state is achieved, the recording may then be terminated and not restarted. This may be made clear to the reader via a signal or a continuous blocking of the recording system. The readout operation which then takes place externally may then be started, or enabled in the first place.

The computer and acceleration sensors 106 may be supplied with a separate operating voltage in order to fill the memory device with the data of acceleration sensors 106, regardless of cells of battery 100 which may have already been partially destroyed. Likewise, the separate operating voltage may be generated by a small accumulator, for example a small lithium accumulator, which is always charged from large battery 100 with the aid of a charging device, provided that the large battery is still in the specified state.

Likewise, the computer may trigger unit 104 in the form of an identification device. The identification device may be a small visual display in the form of a directly visible mark. The display may be generated, for example, as a piezoelectrically triggered, not easily erasable, temperature-resistant color spot (splash) on a temperature-resistant detector field. The state of battery 100 may be directly recognized by the eye, without a further arrangement, via the display.

Likewise, sensor 106, such as an acceleration sensor having the evaluation system, may be mounted in battery 100. Unit 104 may thus be directly controlled by a signal of sensor 106 or a signal provided by a testing unit for testing whether the parameter detected by sensor 106 is inside or outside the tolerance range. For example, each cell of battery 100 may have a unit 104 in the form of a colored identification device on its top side which individually identifies mechanical or chemical or electrical damage at each cell, so that the cells of battery 100 are immediately identified and easily visible as damaged.

Likewise, each cell of battery 100 itself may have a unit which records and registers an acceleration, and may be provided with a unit 104, situated on the cell, in the form of an identification device.

Likewise, the device recording the damage may be an acceleration sensor, a conductivity-detecting strip which may detect saltwater, for example, an overvoltage-detecting component, or a temperature-detecting element which may provide the computer with a signal to be evaluated.

All electrically, physically, or chemically recorded data may also be relayed to a separate unit in the vicinity of batteries 100, in particular on the transport vehicle, or may be further processed there; likewise, a connection with an Internet device or mobile telephone communication device may then be made in this unit, and this unit may be equipped with a separate voltage source which, even in the event of failure of the battery units, may report this and initiate measures. Likewise, device 102 itself, in the form of an arrangement which detects mechanical or thermal damage, may be an identifying device. For example, the arrangement may be a thermal paper or a pressure-sensing or temperature-sensing paper, or a lacquer. In particular, battery 100 or an entire cell may be painted, laminated, or coated with such an arrangement, in parts or in a pattern overlaying the surface, or in strips or points, so that battery 100 is immediately visually identified as damaged on one of its surfaces. If device 102 is implemented by a sensitive coating, for example, a separate sensor 106 is not necessary.

In addition, an arrangement of device 102 may be destroyed by a mechanical effect, and as the result of a chemical reaction or release may go into an irreversible other state which may be read out or detected visually, electrically, chemically, or magnetically. An example is a breaking or melting tube, which as unit 104 contains a dye, or a melting powder made, for example, of a colored wax or polymer or some other element which melts at a certain temperature. In this case as well, no separately implemented sensor 106 is necessary.

Device 102 may function similarly to an igniter which is triggered by impact or heat. Device 102 is thus manufacturable in a very advantageous manner. Device 102 may be activated, for example, by thermal melting of a spring-loaded organic or inorganic wire or a metal body (such as a Wood's alloy). Likewise, a mass may break a wire when accelerations occur. Such cost-effective devices 102 may be mounted on each cell 100 of a battery.

In addition, detecting elements 104 of device 102 may promote chemical reactions in corrosive surroundings, which indicate corrosive action on battery 100, pack 100, module 100, or cell 100. For this purpose, two elements which form a galvanic chain may be mounted adjacently to one another on an absorbent base surface. Under the effect of the corrosive medium, a corrosive reaction may then take place which indicates the corrosive action and makes chemical damage visible. For example, when saltwater contacts a cell, a subsequent reaction may result in corrosive destruction of the cell.

In particular, devices 102 which record the damage may be fixedly, irremovably, and irreversibly connected to battery 100 or a battery cell.

The approach presented here may be used, for example, in batteries 100 in the form of lithium-ion-batteries or other accumulators, or lithium-sulfur accumulators or Li-air accumulators.

Figure 2:
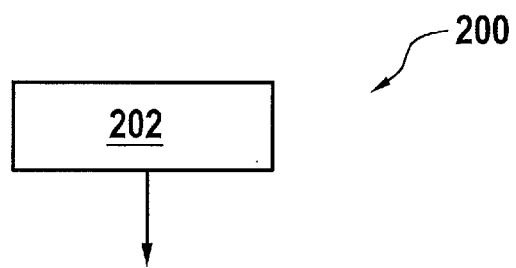
FIG. 2 shows a flow chart of a method for monitoring at least one parameter of a battery according to one exemplary embodiment of the present invention.

FIG. 2 shows a flow chart of a method 200 for monitoring at least one parameter of a battery according to one exemplary embodiment of the present invention. Method 200 may be carried out on a device such as the one illustrated in FIG. 1. Method 200 has a step 202 of providing. A visual damage signal is provided on an outer surface of the battery in step 202 of providing when the at least one parameter of the battery is outside a tolerance range.

Figure 3:
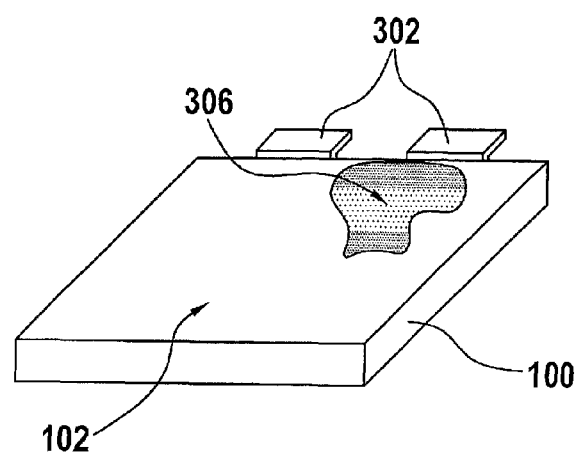
FIG. 3 shows an illustration of a prismatic battery having a device for monitoring at least one parameter of the battery according to one exemplary embodiment of the present invention.

FIG. 3 shows an illustration of a battery 100 in the form of a prismatic accumulator having a device 102 for monitoring at least one parameter of battery 100 according to one exemplary embodiment of the present invention. Battery 100 has a flat, square base body. Battery 100 also has two flat terminals 302 situated next to one another at an edge of battery 100.

As device 102, battery 100 has a coating, which irreversibly changes color, situated on an outer surface of battery 100. The coating is configured to undergo a color change from a normal color to a signal color when the at least one parameter has a value that is greater or smaller than the tolerance range for the parameter. The coating remains in the signal color even if the at least one parameter returns into the tolerance range after leaving it. The normal color may be any arbitrarily selectable color. In the present exemplary embodiment the normal color is blue. The signal color may be a conspicuous color. The signal color may also be active in a wavelength range outside visible light. For example, the signal color may convert ultraviolet wavelengths into visible wavelengths. Battery 100 may then be checked particularly well under difficult viewing conditions. In the present exemplary embodiment, the signal color is visible in the visible wavelength range. The signal color is generally detected as a warning color. In the present case, the signal color has red as a first color and yellow as a second color. The color may indicate, for example, the extent of the departure of the parameter from the tolerance range. For example, the first color may mark a warning range. The second color may mark a critical range. Likewise, the colors may indicate whether the value of the parameter has exceeded or fallen below the tolerance range.

In the exemplary embodiment shown in FIG. 3, the coating has an area 306 in which the coating is changed from the normal color into the signal color. Area 306 signals damage to battery 100. Area 306 is situated on an outer surface of battery 100 in the vicinity of one of terminals 302. In the present exemplary embodiment, the coating is temperature-sensitive, and signals that in area 306 a temperature of battery 100 or of the outer surface of battery 100 has increased above an upper limit of the tolerance range for the temperature, or has increased at a time in the past. Area 306 has a first zone, a second zone, and a third zone. In the first zone and the third zone the coating has the signal color in the first color, for example red, and in the second zone the coating has the signal color in the second color, for example yellow. The zones are situated next to one another in the shape of a strip. At zone boundaries between the zones, the signal color has a color gradient, for example from red to orange to yellow. At this location, the colors represent an achieved maximum temperature above the upper limit of the tolerance range. The temperature in the zone having the second color was or is higher than the temperature in the zone having the first color. The colors may also represent different parameters, each of which is and/or has been present outside its tolerance range.

Figure 4:
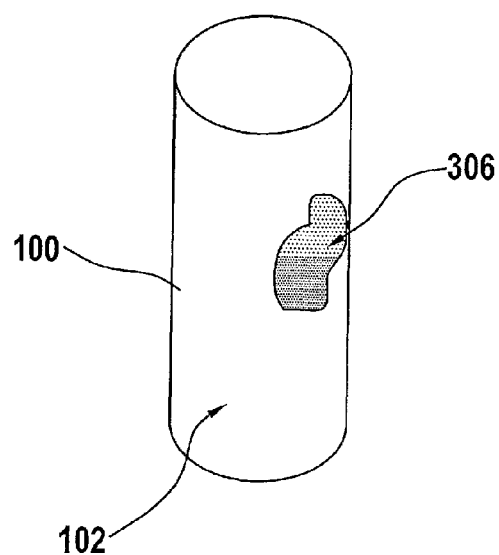
FIG. 4 shows an illustration of a cylindrical battery having a device for monitoring at least one parameter of the battery according to one exemplary embodiment of the present invention.

FIG. 4 shows an illustration of a cylindrical battery 100 having a device 102 for monitoring at least one parameter of battery 100 according to one exemplary embodiment of the present invention. The same as in FIG. 3, device 102 is formed by a coating on a surface of battery 100. The coating likewise changes from a normal color into a signal color when at least one parameter to which the coating is sensitive is outside a tolerance range. In contrast to the battery in FIG. 3, battery 100 shown in FIG. 4 is configured as a round cell 100 having a cylindrical base body with two circular end faces. Terminals of battery 100 are not illustrated. The normal color of the coating is blue, for example, as in FIG. 3. The signal color is red, for example. As shown in FIG. 3, an area 306 colored in the signal color on the surface of battery 100 represents a location on battery 100 at which the at least one parameter of battery 100 is and/or has been outside the tolerance range. In the present exemplary embodiment, an intensity of the signal color, in this case red, for example, indicates over which time period the at least one parameter has been outside the tolerance range up to the instantaneous point in time. The longer the at least one parameter remains outside the tolerance range, the more intense the signal color may become. The intensity may be further increased if the at least one parameter is or has been outside the tolerance range multiple times.

In other words, FIGS. 3 and 4 show an illustration of an irreversible color change, resulting from a large temperature increase, of the colored coating on the accumulator surface which is used as device 102. The accumulator and battery housing 100 have a specialized colored coating for displaying critical temperatures. Lithium-ion batteries 100 are used as energy stores in a variety of products. For example, such batteries 100 may be used in motor vehicles.

A battery 100 may locally or globally heat up or build up pressure, for example due to a "hot spot" or as the result of a manufacturing defect or unintentional mishandling. The approach presented here allows a resulting change in battery 100 to be recognized by the naked human eye. This may be of particular importance, since the other physical or electrical parameters and specification values after such events may be unnoticeable and practically unchanged in terms of manufacturing and specification tolerances. This type of damage, which is usually completely unnoticeable, over time may result in not only reduced performance or a decreased service life, but also in safety-critical behavior of accumulator or battery 100.

In the exemplary embodiment shown here, a high local or global temperature increase of battery 100 which has undesirably occurred may be made visible with the aid of an irreversible temperature-sensitive coating applied to the casing of battery 100, due to a heat-related change in the color of the coating. Timely identification and sorting out of such accumulators or batteries 100 is thus possible.

Battery 100 has an irreversible temperature-sensitive colored coating of the casing or housing of battery 100 for making undesirable locally or globally occurring temperature increases visible. Batteries 100 which have experienced an excessively high temperature may thus be identified and sorted out. The described temperature increases frequently cause irreversible damage to battery 100, which not uncommonly results in significant degradation of the electrical and safety-relevant properties of battery 100 over time. However, the degraded electrical and safety-relevant properties of battery 100 due to the above-mentioned events are often manifested in a delayed manner. The approach presented here thus allows such noticeable batteries 100 to be discovered in real time, at the point in time of accumulator manufacture, accumulator transport, or delivery of accumulators to customers, as well as during operation. This allows easy and cost-effective quality monitoring as well as the selection of batteries 100, which due to the described irreversible damage could be critical to safety in the future and would also mean an irreversible loss of power.

The coating is thus a cost-effective instrument for ensuring and checking the quality and safety of batteries 100.

The colored coating of the accumulator casing proposed here is used as a visual display or indicator of reaching and exceeding critical temperatures of battery 100. The colored coating is implemented, for example, via a lacquer such as an MC (multi-colored) lacquer which displays temperatures between 60° C. to 590° C. as an irreversible color change 306. The thermal lacquer may be directly applied, or affixed as a lacquered film to battery 100. Events during which temperatures above 60° C., 80° C., 100° C., or 120° C. are reached may be depicted with spatial resolution based on color change 306 of the colored coating. So-called "hot spots" which occur at a locally delimited area 306 of the cell are visible on the accumulator or battery surface. The color changes 306 on the thermal lacquer represent the maximum temperatures that have occurred. Events during which temperatures beyond 60° C., 80° C., 100° C., or 120° C. are reached result in irreversible damage in lithium-ion accumulators, for example, even if this damage is possibly only locally delimited. Battery 100 may also be equipped with a separator (PE/PP/PE, for example) which begins to melt at 100° C., for example, which may be indirectly recognized by a corresponding color change. The colored coating of the battery housing allows a simple selection of potentially critical accumulators, batteries 100, or battery objects.

The exemplary embodiments described and shown in the figures are selected only as examples. Various exemplary embodiments may be combined with one another, in their entirety or with regard to individual features. In addition, one exemplary embodiment may be supplemented by features of another exemplary embodiment. Furthermore, method steps according to the present invention may be carried out in a different order than that described. If an exemplary embodiment includes an "and/or" linkage between a first feature and a second feature, this may be construed in such a way that according to one specific embodiment, the exemplary embodiment has the first feature as well as the second feature, and according to another specific embodiment, the exemplary embodiment either has only the first feature or only the second feature. The mentioned colors are selected only as examples, and may be replaced or supplemented by other colors.

What is claimed is:

1. A method for monitoring at least one parameter of a battery, the method comprising:
   monitoring accelerations to determine whether an acceleration acting on the battery is outside a tolerance range; and
   responsive to determining, in the monitoring, that the acceleration acting on the battery is outside the tolerance range, providing a visual damage signal on an outer surface of the battery.

2. The method of claim 1, wherein the damage signal is also provided when the acceleration is once again within the tolerance range.

3. The method of claim 1, further comprising providing a visual indication responsive to detection of at least one of a temperature, a mechanical deformation, an electrical voltage, an electrical current, and moisture being outside a tolerance range.

4. The method of claim 1, wherein in the providing task, the damage signal is generated in the form of a color marking on the outer surface of the battery.

5. The method of claim 1, further comprising:
   generating an electrical control signal responsive to the acceleration being determined to be outside the tolerance range, the damage signal being provided in response to the electrical control signal.

6. The method of claim 1, wherein in the providing task, the damage signal is provided using an electrical, mechanical, or electromechanical unit situated on the outer surface of the battery for applying the damage signal to the outer surface.

7. The method of claim 1, wherein in the providing task, the damage signal is provided on the outside of the battery using a color change of particles.

8. A device for monitoring at least one parameter of a battery, comprising:
   a monitoring arrangement; and
   a signal arrangement, wherein the monitoring arrangement is configured to monitor accelerations to determine whether an acceleration acting on the battery is outside a tolerance range, and the signal arrangement is configured to, in response to a determination by the monitoring arrangement that the acceleration acting on the battery is outside the tolerance range, provide a visual damage signal on an outer surface of the battery.

9. A battery, comprising:
   a device for monitoring at least one parameter of a battery, the device including:
   a monitoring arrangement; and
   a signal arrangement, wherein the monitoring arrangement is configured to monitor accelerations to determine whether an acceleration acting on the battery is outside a tolerance range, and the signal arrangement is configured to, in response to a determination by the monitoring arrangement that the acceleration acting on the battery is outside the tolerance range, provide a visual damage signal on an outer surface of the battery.

10. The battery of claim 9, wherein the device includes particles configured to irreversibly change color as the visual damage signal when the acceleration is outside the tolerance range.

* * * * *